(12) United States Patent
Zahlmann et al.

(10) Patent No.: US 11,162,984 B2
(45) Date of Patent: Nov. 2, 2021

(54) DEVICE FOR DETECTING ELECTRICAL CURRENTS ON OR NEAR ELECTRICAL CONDUCTORS

(71) Applicant: DEHN SE + CO KG, Neumarkt/Opf. (DE)

(72) Inventors: Peter Zahlmann, Neumarkt (DE); Josef Birkl, Berching (DE); Thomas Böhm, Hohenfels (DE); Klaus Bühler, Eckental (DE); Johannes Maget, Parsberg (DE); Arnd Ehrhardt, Neumarkt (DE); Eduard Shulzhenko, Ilmenau (DE)

(73) Assignee: DEHN SE + CO KG, Neumarkt/Opf. (DE)

( * ) Notice: Subject to any disclaimer, the term of this patent is extended or adjusted under 35 U.S.C. 154(b) by 86 days.

(21) Appl. No.: 16/614,430

(22) PCT Filed: May 22, 2018

(86) PCT No.: PCT/EP2018/063325
§ 371 (c)(1),
(2) Date: Nov. 18, 2019

(87) PCT Pub. No.: WO2018/215424
PCT Pub. Date: Nov. 29, 2018

(65) Prior Publication Data
US 2020/0182915 A1 Jun. 11, 2020

(30) Foreign Application Priority Data

May 24, 2017 (DE) .......................... 102017111477.7
Mar. 28, 2018 (DE) .......................... 102018107475.1

(51) Int. Cl.
*G01R 19/165* (2006.01)
*G01R 15/14* (2006.01)
*G01R 31/52* (2020.01)

(52) U.S. Cl.
CPC ..... *G01R 19/16509* (2013.01); *G01R 15/148* (2013.01); *G01R 31/52* (2020.01)

(58) Field of Classification Search
CPC ............ G01R 19/165; G01R 19/16509; G01R 19/16571; G01R 31/52; G01R 15/14; G01R 15/148
See application file for complete search history.

(56) References Cited

U.S. PATENT DOCUMENTS

| 3,789,293 A | 1/1974 | Freeze | 324/102 |
| 4,101,826 A | 7/1978 | Horsitmann | 324/543 |

(Continued)

FOREIGN PATENT DOCUMENTS

| DE | 2524376 A1 | 12/1976 | C25B 15/06 |
| DE | 2700995 A1 | 7/1978 | B60Q 11/00 |

(Continued)

OTHER PUBLICATIONS

Office Action (in German), dated Nov. 5, 2018, issued by the German Patent Office for Applicant's corresponding German Patent Application No. DE102018107475.1, filed Mar. 28, 2018.

(Continued)

*Primary Examiner* — Son T Le
(74) *Attorney, Agent, or Firm* — Bodner & O'Rourke, LLP; Gerald T. Bodner; Christian P. Bodner

(57) ABSTRACT

The invention relates to a method for detecting electrical currents on or near electrical conductors with at least one reed switch as a magnetically responsive switch, which is arranged near the electrical conductor such that when there is a significant current flow through the conductor, the (Continued)

Figure 1:
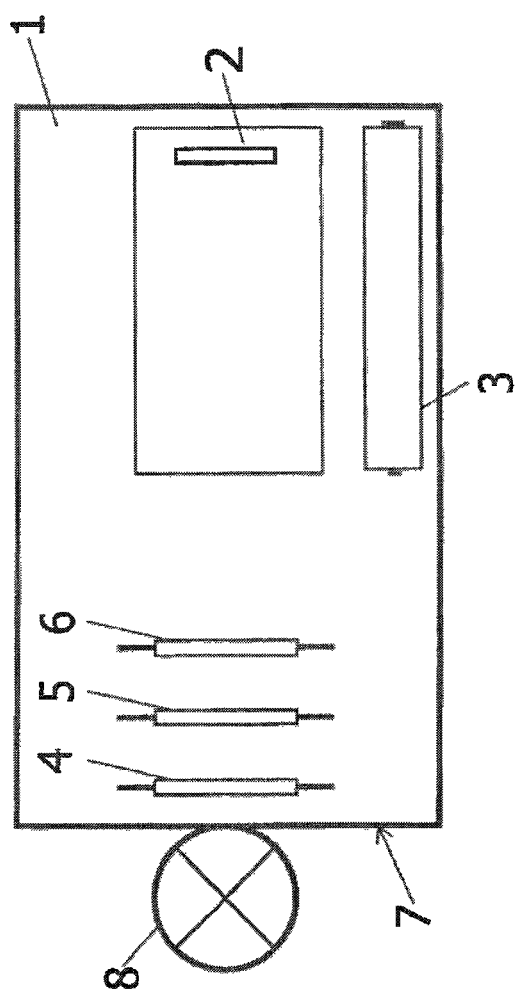

magnetic field created triggers the switch and initiates evaluation electronics connected to the switch. For the detection of surge current variables and differentiation between long-term pulsed currents and short-term pulsed currents, a plurality of reed switches is arranged at predetermined, different, increasing distances from the electrical switch, the evaluation electronics determining the response and the switching times of the respective reed switches. The surge current variables are determined from the association of the determined values with the respective reed switch and the pulse shape from the switching time.

15 Claims, 3 Drawing Sheets

(56) References Cited

U.S. PATENT DOCUMENTS

| | | | | |
|---|---|---|---|---|
| 4,620,156 | A * | 10/1986 | Alvin | H01H 1/0015 |
| | | | | 324/424 |
| 2011/0309830 | A1 | 12/2011 | Teng et al. | 324/300 |
| 2012/0029853 | A1 * | 2/2012 | Baumheinrich | F03D 17/00 |
| | | | | 702/65 |
| 2012/0250205 | A1 * | 10/2012 | Pfitzer | H02H 9/041 |
| | | | | 361/91.1 |
| 2015/0061692 | A1 * | 3/2015 | Kostakis | G01R 31/2827 |
| | | | | 324/537 |
| 2018/0238947 | A1 | 8/2018 | Birkl et al. | |

FOREIGN PATENT DOCUMENTS

| | | | |
|---|---|---|---|
| DE | 2826247 C2 | 3/1984 | ........... G01R 19/165 |
| DE | 19733268 A1 | 2/1999 | ............... H02H 3/08 |
| DE | 19930089 A1 | 1/2001 | ............. H01H 71/10 |
| DE | 10329223 A1 | 1/2005 | ............. H01H 71/24 |
| DE | 10329223 B9 | 5/2006 | ............. G01R 15/18 |
| EP | 1065690 A2 | 1/2001 | ............. H01H 71/10 |
| RU | 2554282 C1 | 6/2015 | ............. G01R 19/30 |
| WO | WO2017036793 A1 | 3/2017 | ............. F03D 17/00 |

OTHER PUBLICATIONS

Notification Concerning Transmittal of International Preliminary Report on Patentability (Chapter I of the Patent Cooperation Treaty), in English, dated Dec. 5, 2019, which was issued by the International Bureau of WIPO in Applicant's corresponding international PCT application having Serial No. PCT/EP2018/063325, filed on May 22, 2018.

English translation of the International Preliminary Report on Patentability (Chapter I of the Patent Cooperation Treaty), dated Nov. 26, 2019, which was issued by the International Bureau of WIPO in Applicant's corresponding international PCT application having Serial No. PCT/EP2018/063325, filed on May 22, 2018.

Written Opinion of the International Searching Authority, in English, dated Aug. 30, 2018, which was issued by the International Bureau of WIPO in Applicant's corresponding international PCT application having Serial No. PCT/EP2018/063325, filed on May 22, 2018.

International Search Report, in English, dated August 30, 2018, which was issued by the International Bureau of WIPO in Applicant's corresponding international PCT application having Serial No. PCT/EP2018/063325, filed on May 22, 2018.

* cited by examiner

DEVICE FOR DETECTING ELECTRICAL CURRENTS ON OR NEAR ELECTRICAL CONDUCTORS

The invention relates to a device for detecting electrical currents on or near electrical conductors with at least one reed switch as a magnetically responsive switch, which is arranged near the electrical conductor such that when there is a significant current flow through the conductor, the magnetic field created triggers the switch and initiates evaluation electronics connected to the switch, according to claim 1, as well as to a use of such a device for detecting and classifying lightning current events and overcurrent events according to claim 14.

From DE 2 826 247 C2, a short-circuit indicator for electric lines is already known.

The short-circuit indicator has a reed contact that is controlled by the magnetic field of an electric line, and an electronic self-holding circuit. The self-holding circuit is configured as a flipflop circuit controlling both an electronic counter and a clock generator. The clock generator initiates a flashlight signal generator. The electronic counter resets the flipflop circuit when time has elapsed and stops the clock generator.

The employed reed contact is arranged in a parallel plane to the current conductor such that, in the moment of a short-circuit, a correspondingly great magnetic field is created acting upon the reed contact and closing it at least for a short time.

Thus, a supply voltage reaches the input of the flipflop circuit so that the same transits into the self-holding position.

By twisting the reed contact around the imaginary longitudinal axis of a housing, the sensitivity thereof is reduced. This allows the short-circuit indicator to be set in the factory to determined scaled tripping currents, for example, in the range of 200 to 400 A.

DE 103 29 223 B9 discloses a short-circuit sensor which utilizes the force of the magnetic field of a short-circuit current to close a reed contact mounted on a circuit board such as to be settable to a determined tripping current by a rotation of between 0 and 90°.

DE 27 00 995 A1 relates to a monitoring system for an electric load through which current flows.

The load is in particular in the form of brake or tail lamps of a motor vehicle. In the magnetic field generated by the current flowing through the supply line of the load, a magnetic field-dependent switch is arranged leading to a display device. In particular, a reed contact is used as a switch.

In a preferred embodiment, the switch is arranged in the interior of a coil formed by the load supply line so that the magnetic field surrounding every single conductor is superimposed on the adjacent coil windings so as to obtain a sufficient response sensitivity.

In a configuration of the teaching therein, the coil and the switch that can be actuated as a function of the magnetic field are combined as a constructional unit that can be looped into the supply line of the load.

In the arrangement for selectively tripping cascaded and selectively switched protective switches, in which a protective switch directly affected by the short-circuit outputs a blocking signal to a tripping system according to DE 199 30 089 A1, a protective tube contact is magnetically coupled to each main current path of a subsequent protective switch, and electrically connected to the tipping system of the upstream protective switch.

Preferably, the protective tube contact is arranged in the proximity of a connecting terminal of the protective switch.

The solutions of the state of the art described above have in common that a reed contact constitutes the basis of a switch, with the switch being actuatable by a magnetic field. If there is sufficient magnetic energy, the contact tongues of a reed switch known per se will get into a contact closing position with the consequence that the electric circuit, in which the switch is situated, will be closed. On the basis of utilizing such reed switches, electric circuits can be monitored and the function thereof signalized. Moreover, a short-circuit current can be identified by defining the short-circuit current itself as a threshold value, the magnetic field of which is capable of closing the reed contact, i.e. the switch.

From the aforementioned, the task of the invention is to propose a further developed device for detecting electrical currents on or near electrical conductors with at least one reed contact as a magnetically responsive switch, wherein the device is not only capable of defining a switching state upon achieving a determined current flow in the electrical conductor, but there is also the possibility of detecting current pulses and thus surge currents and to assess them, without complex electronic and therefore expensive and trouble-prone circuits being required as is the case in so-called lightning counters.

The solution of the task is performed by a device according to the feature combination of claim 1, and the use according to the invention of the teaching according to claim 14, with the dependent claims representing at least appropriate configurations and further developments.

As a result of extensive studies, it has been found surprisingly that by means of an arrangement of a plurality of reed contacts, which arrangement is quasi spatially staggered, spaced in relation to one electrical conductor and/or scaled in its sensitivity, surge current variables may be determined and differentiated. In this case, it has been shown in a particularly surprising manner that not only long-term pulsed currents are identifiable but also short-term pulsed currents can be assessed. The device according to the invention functions in this case in a trouble-free manner also in a rough environment and under the influence of mechanical shocks and vibrations which is again surprising with regard to certain applications, for example, the monitoring of lightning strikes in wind turbines.

Due to their construction, reed contacts inherently have mechanical inertia, which does not allow a reproducible response at extremely short-term pulse loads to be expected. Partially already during the pulse process, the determined and defined response of the sensitive contacts is just as unpredictable as the likewise reproducible response of contacts of lower sensitivity or higher mechanical inertia which is still noticeable after the pulse load without a further influencing magnetic field. Furthermore, the overload resistance, in particular of the sensitive reed contacts, is surprising. Both pulsed currents of <100 A and small long-term current can be detected with certainty. In case of significantly higher pulse loads of up to 250 kA at magnetic field loads being above the response voltage by the factor 1000 or higher, the mechanical components of the respective reed contact will neither be mechanically destroyed or damaged by the high dynamic forces so that a reproducible detection of pulsed currents is possible even after such multiple loads.

By a positioning according to the invention of the respective reed contact and an almost loop-free supply of the terminals, a disadvantageous coupling of currents into the path of the contacts may be reduced to an extent that the necessary sensitive contacts having very small switching currents will not by damaged by the currents induced during closing along with a possibly high-frequency bouncing by preventing break sparks. Additional circuitries of the reed contact allow spark formation to be prevented. Active or passive overvoltage protection measures allow an undesired coupling of currents into the connection loop of the reed contacts to be reduced.

The device according to the invention for detecting electrical currents while using reed contacts may be integrated into a so-called intelligent lightning rod or may constitute an integral part of such a lightning rod, in order to be able to assess lightning events.

According to a further application example, the device according to the invention for detecting currents may be used in such conductors which are an integral part of a structural installation and are used as an arresting device according to EN 62305-3. The reed contacts may also be installed on or near electrically conductive components, which, in principle, are not provided for lightning protection but via which a partial lightning current may flow. By way of example, reference is made to hoisting cables of cableways, holding cables of cranes or the like. In this regard, a possible damage on such cables by partial lightning currents can be identified at an early stage, so as to initiate suitable measures, for example, the exchange of damaged cables.

The galvanic isolation and the spacing of the device together with its electronic components from the discharge line through which lightning current flows, which result from a use of the reed contacts, allow for a trouble-free operation over a long period of time without any maintenance expenditure.

The device according to the invention may likewise be an integral part of overvoltage arresters or be used for assessing the load of overvoltage arresters, by actually integrating the device according to the invention into the corresponding current path, respectively is allocated to it.

Thus, the device according to the invention represents a cost-efficient alternative to complex measurement systems which are otherwise used, for example, while using so-called Rogowski coils.

In its use, the device according to the invention enables a double function to be achieved by detecting parasitic current pulses, for example, on the basis of lightning events, on the one hand, and these are differentiable with respect to the pulse shape and pulse duration but also the magnitude of the current.

The device according to the invention for detecting current on or near electrical conductors accordingly is based on a reed contact as a magnetically responsive switch, which is arranged near the electrical conductor such that when there is a significant current flow through the conductor, the magnetic field created triggers the switch and initiates evaluation electronics connected to the switch.

According to the invention, for the detection of surge current variables and differentiation between long-term pulsed currents, on the one hand, and short-term pulsed currents, on the other, a plurality of reed contacts is arranged at predetermined, different and increasing distances from the electrical conductor.

The evaluation electronics determine the response and the switching times of the respective reed contacts. The surge current variable may be obtained or determined from the association of the determined values with the respective reed contact, respectively its spatial arrangement and from the distance from the electrical conductor, and from the switching time, the pulse shape may be obtained or determined, preferably while using a microcontroller.

According to the invention, not only reed contacts with closing function may be used. There is likewise the option to use opening reed contacts. Corresponding opening contacts may be realized in combination with a permanent magnet so that the response behavior of the contact is settable.

It is therefore in the sense of the invention to set the response behavior in terms of differentiating the currents not only by a spatially spaced configuration but also to use further criteria. For setting limits of the response behavior of the respective reed contacts, a shield may be applied. This shield may be realized as a metallic sleeve or a metallic layer. To counteract high-frequency processes, for example, metallic sleeves or layers for generating eddy currents on the basis of copper or aluminum materials are expedient. For reducing the sensitivity in case of low-frequency processes, materials having high permeability, for example, soft-magnetic steels may be used.

For utilizing both of the effects, materials having high permeability and additionally having electrically conductive coatings, for example, of copper, may be employed. Due to the saturation of materials having high permeability in case of strong magnetic fields, scaling of the shielding materials each surrounding the respective reed contact is advantageous.

Consequently, the shieling allows the sensitivity of the reed contacts to be individually set and modified so that, in the end, the use of standard reed contacts having the same sensitivity and the same design becomes possible.

Due to the limits of the different spatial spacings of the reed contacts from the electrical conductor, opening contacts of the same layout having different opposite field contacts may be used as an alternative or in addition. The use of closing devices, which, apart from the distance, are additionally shielded against the impact of magnetic fields, is likewise possible.

In an embodiment of the invention, the electrical conductor is an integral part of a lightning current arrester line, a lightning rod or a conductive component via which a lightning current may flow in principle.

In a further embodiment of the invention, the electrical conductor is an integral part of a surge current carrying overvoltage arrester.

Apart from the preferred microcontroller, the evaluation electronics also comprise a data storage.

Stored data may be transferred in a wireless or wired manner, e.g. by means of fiber optics (FO), to a superordinate unit for long-term analysis of pulse-shaped surge currents or long-term currents.

This enables, for example, by integrating a plurality of devices according to the invention in complex building to detect loads with respect to overcurrent events, to store and evaluate them for site or risk analysis.

In order to guarantee a permanent, maintenance-free use of the device, it is equipped with a long-term current supply.

Since the device according to the invention usually is in a so-called sleep mode and is only activated when overcurrent events occur, only extremely low standby currents arise which lead to desired long operating times without change of a battery or accumulator battery.

In a configuration of the invention, the device according to the invention may also take energy from the mains to which the current-carrying conductor usually is connected.

The energy required for pulse registration or for operating the evaluation circuit may be obtained from the actual interfering od measurement signal, i.e. the pulse itself.

An alternative option for obtaining operating power is the so-called energy harvesting. In this case, energy generation from a movement or else by using photovoltaic elements may be realized.

In a further development of the invention, the device comprises a radio module for data transmission, wherein, according to the invention, the data transmission is only initiated after expiry of a predetermined time span after vanishing of the last surge current pulse. In this way, a trouble-free data transmission is guaranteed.

In one embodiment of the invention, at least the reed contacts are fixed onto a planar wiring carrier, for example, a copper-coated circuit board, wherein a first group of reed contacts is arranged on a first one of the sides of the wiring carrier, and a second group of reed contacts is arranged on the second side of the wiring carrier opposite the first side.

In this case, the first group includes two reed contacts, for example, and the second group one reed contact, for example.

In a preferred configuration of the invention, the angular position of the groups of reed contacts with respect to the electrical conductor is fixedly specified and not variable in order to achieve reproducible measurement results.

Moreover, according to the invention, a housing receiving the components of the device is formed which has a front or side surface provided with means for marking the position and/or for attaching the electrical conductor.

In this way, a correct allocation between the field forming around the conductor in case of a current flow and the reed contacts present within the housing is guaranteed when the device is used or mounted on or near an electrical conductor.

Due to the fact that the housing does not need to have openings for receiving or passing through the electrical conductor, the housing can be designed for highest degrees of protection, i.e. for outdoor use and under critical environmental conditions.

In a particular variant of the device according to the invention, it is designed such that an arrangement on or near lightning arrester ropes of rotor blades in wind turbines takes place. By means of a downstream counting device, the number but also the intensity and the pulse shape of lighting current events may be detected in order to conclude from them whether the so-called receptors present on the surface of rotor blades of wind turbines are possibly already excessively loaded or melted so that a service assignment or a repair can be scheduled.

The device according to the invention may also be utilized for monitoring and assessing possible lightning strikes in hoisting cables, for example, of cableways. The detection of lightning currents in the hoisting cables is realized by correspondingly arranged and designed sensors with reed contacts in the sense of the explained teaching. When lightning currents or partial lightning currents have been detected, a report is made to a superordinate inspection device. This then allows the necessity of a supervision of the hoisting cable to be concluded and, if necessary, an operational interruption to be ordered. The detection of long-term currents is particularly problematic in such applications. Long-term currents are substantial for melting processes occurring on the hoisting cable, which are possible especially in winter thunderstorms.

The proposed energy self-sufficient functional mode of the detection device according to the invention without any galvanic connection to a supply network has the advantage that separation distances from the measurement device are not required to be observed.

The inventive use of the presented device is aimed at the detection and classification of lightning and overcurrent events even of that kind which are not caused by lightning currents but have a surge current characteristic in the range of >50 A up to 200 kA, and is aimed at a detection of events of the pulse shapes as a long-term pulse of T≥10 ms and pulse shapes in the form of 10/350 μs and 8/20 μs.

The invention will be explained below in more detail based on an exemplary embodiment and on figures.

FIG. 1 shows in this case a principle arrangement of the device according to the invention with three reed contacts, for example, at a defined distance from the electrical conductor.

Figure 2:
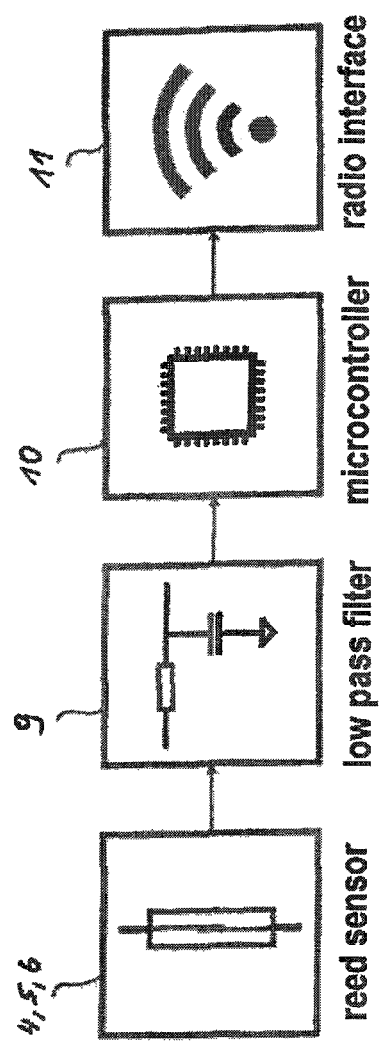

FIG. 2 shows a simplified block diagram of the evaluation electronics with a low pass filter 9 arranged downstream of the respective reed sensor 4; 5; 6, the respective output of this low pass filter 9 leading to a microcontroller 10 connected to a radio interface 11 on the output side.

Figure 3:
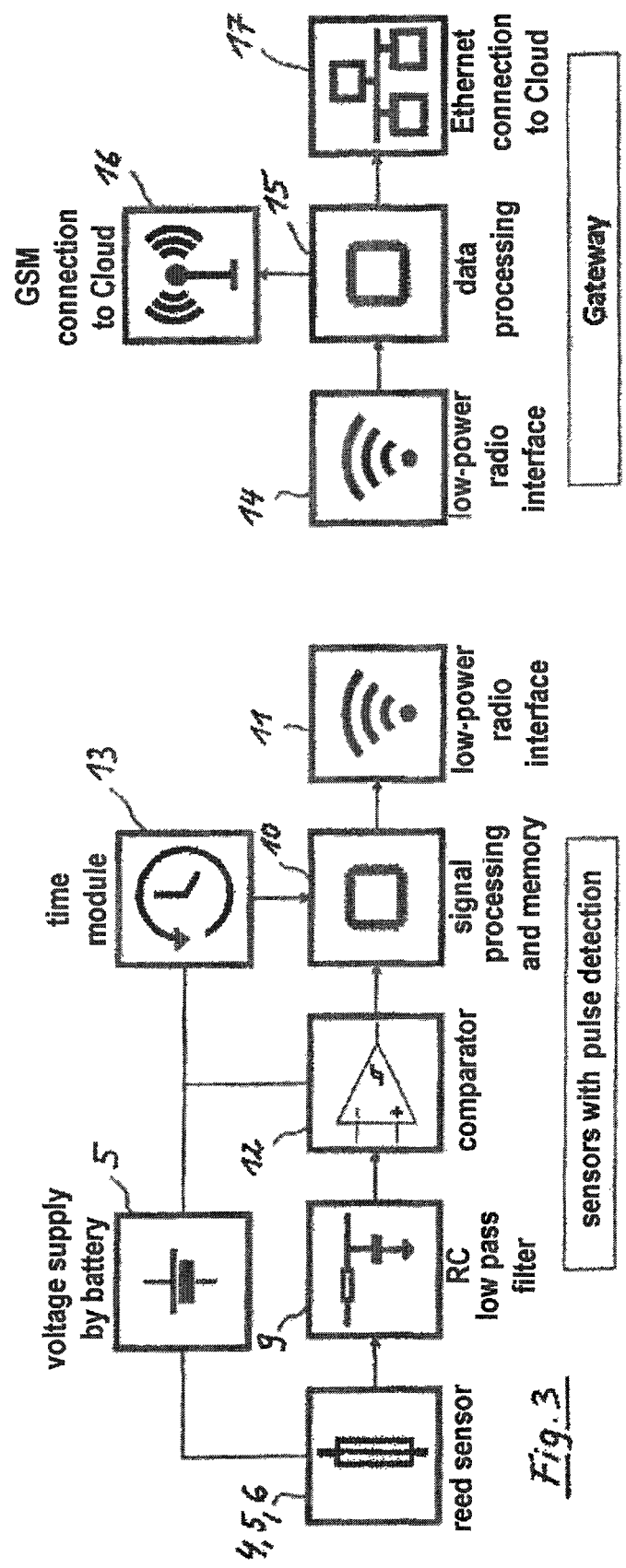

The block diagram according to FIG. 3 in turn is based on reed sensors 4; 5; 6 connected to an R-C low pass filter 9.

For determining the switching time of the respective reed sensor 4; 5; 6, the low pass filters each are connected to the input of a comparator 12 whose output leads to the microcontroller 10 in addition to the storage unit.

In this respect, a time module 13 is present leading to the comparison input of the comparator 12. The battery 5 already explained in relation to FIG. 1, is used for the voltage supply. By means of the time module 13 and the microcontroller 10, the pulse shape detected from the switching time of the respective reed sensor or reed contact 4; 5; 6 may be determined in a signal processing manner.

The assemblies 11 and 14 form an air interface and guarantee a wireless data transmission of the detected surge current variables.

A further signal processing and control unit 15 is connected to a communication component 16 in order to guarantee a cloud connection, e.g. via GSM. As an alternative, a classical Internet connection for data evaluation and long-term analysis may be realized by means of the component 16.

The device according to the exemplary embodiment of FIG. 1 is based on a circuit board 1 which includes an evaluation unit with a radio module 2 and a power supply of long-term stability in the form of a battery 3.

At or on a planar side portion of the circuit board 1 or wiring carrier, three spaced reed contacts 4, 5 and 6 are arranged substantially in parallel to one another.

To a so to speak stop edge 7 of the circuit board 1, an electrical conductor 8 is applied. This can be, for example, an arrester cable of a rotor of a wind turbine.

If surge current flows through the arrester cable 8, a magnetic field is formed around the arrester cable and penetrates the spaced reed contacts 4, 5, 6 at different intensities.

By way of example, it is assumed that the reed contact 4 has a distance of 5 mm from the conductor, the reed contact 5 is at a distance from the conductor of 15 mm, and the reed contact 6 is at a distance from the conductor of 105 mm.

The reed contact 4 is capable of detecting long-term pulses of Imin≥50 A and a pulse duration of T≥10 ms. Likewise, the reed contact 4 being at the closest distance from the arrester cable 8 may detect surge current pulses of the pulse shape of 10/350 μs with Imin≥60 A and surge current pulses of the pulse shape of 8/20 μs with Imin≥70 A.

The reed contact 5 is capable of detecting pulsed currents of the pulse shape of 10/350 μs with Imin≥200 A and pulsed currents of 8/20 μs with Imin≥750 A.

The reed contact relay 6 being at a distance of about 105 mm from the arrester cable 8 is capable of detecting pulses of the pulse shape of 10/350 μs with Imin≥4.5 A and pulses of the pulse shape of 8/20 μs with Imin≥67 A.

By means of the evaluation electronics integrated into the device, the different switching times of the reed contacts can be detected and evaluated depending on the pulse shape, so that it can be identified which are the pulse shapes having which pulse durations. A circuit arrangement according to FIG. 3 preferably is used for this purpose.

A differentiation in the range of about 60 A up to 250 kA may likewise be performed by the selective response of the reed contacts in the case of corresponding surge currents.

In case of a lightning or surge current event, this will be first detected by at least one reed contact responding. Subsequently, a differentiation of the measured current intensities by the response behavior of the single reed contacts takes place. The recorded data items are stored while taking into account the temporal progress and time delta to subsequent events, respectively and are available for further evaluation.

In a device according to the invention tested in the test field, the detectable minimum current intensity is about 45 A. The use of three reed contacts, for example, allows three pulse thresholds to be specified and evaluated. A further extension of the microcontroller used for the evaluation allows a further diversification to be performed without departing from the basic principle of the invention.

Components for the long-term storage and analysis of the detected values, which components possibly become necessary, may be mounted spatially remote from the device according to the invention in EMV protected spaces. This is possible since the measured values provided by the device preferably takes place in a wireless transmission to the downstream arranged evaluation unit, and this transmission can only be triggered after the last trouble event has vanished.

A fixedly set delay time between the occurring lightning event and the sending of the event protocol allows a time allocation in a precision of milliseconds or a time stamp in a precision of milliseconds to be achieved.

The following exemplary trigger thresholds of the reed contacts resulted after tests conducted:

TABLE 1

Trigger thresholds of the reed contacts

| Pulse shape | reed 1 | reed 2 | reed 3 |
|---|---|---|---|
| 8/10 μs | 350 A | 1250 A | 67 kA |
| 10/350 μs | 140 A | 260 A | 4.5 kA |
| dc test field | 141 A | — | — |

The trigger thresholds of the reed contacts may be greatly varied by the spacing and the type of the contacts. In these trigger thresholds, a differentiation may be made between $I_{cc\,only}$ and a short-term pulse. If the third reed contact should be triggered at a higher current intensity, the distance may be further increased. In the different arrester cables (95 mm², ∅=11 mm, isolating wall thickness=2.5 mm, 50 mm², ∅=8 mm, isolating wall thickness=2.5 mm) a deviation of the trigger threshold of 10 A could be observed. In pulses of 10/350 the trigger threshold is markedly lower as compared to pulses of 8/20.

The following dependency of the response as of a certain distance from the arrester cable may be recognized inter alia between the trigger thresholds of the reed contacts of the pulses of 8/20 and 10/350.

$$\frac{\int (I_{8/20}(t))^2 dt}{\int (I_{10/350}(t))^2 dt} \approx 15$$

The invention claimed is:

1. A device for detecting electrical currents on or near electrical conductors with at least one reed contact as a magnetically responsive switch, which is arranged near the electrical conductor such that when there is a significant current flow through the conductor, the magnetic field created triggers the switch and initiates evaluation electronics connected to the switch,
characterized in that
for a detection of surge current variables and differentiation between long-term pulsed currents having a duration of T≥10 ms, on the one hand, and short-term pulsed currents having a pulse shape of 10/350 μs or 8/20 μs, on the other, a plurality of reed contacts (4; 5; 6) is arranged at pre-determined, different and increasing distances from the electrical conductor (8), wherein the evaluation electronics determine the response and the switching times of the respective reed contacts (4; 5; 6), from the association of the determined values with the respective reed contact, the surge current variable is determined, and from the switching time, the pulse shape is determined.

2. The device according to claim 1,
characterized in that
the electrical conductor is an integral part of a lightning current arrester line or a lightning rod.

3. The device according to claim 1,
characterized in that
the electrical conductor is an integral part of a surge current carrying overvoltage arrester.

4. The device according to claim 1,
characterized in that
the evaluation electronics (2) comprise a microcontroller and a data storage.

5. The device according to claim 4,
characterized in that
the stored data items are transferred in a wireless or wired manner to a superordinate unit for long-term analysis of pulse-shaped surge currents.

6. The device according to claim 4,
characterized in that
a radio module for data transmission is provided, wherein the data transmission is only initiated after expiry of a predetermined time span after vanishing of the last surge current pulse.

7. The device according to claim 1,
characterized in that
the device comprises a self-sufficient long-term power supply (3).

8. The device according to claim 1,
characterized in that
at least the reed contacts (4; 5; 6) are fixed onto a planar wiring carrier, wherein a first group of reed contacts is arranged on a first one of the sides of the wiring carrier (1), and a second group of reed contacts is arranged on the second side of the wiring carrier (1) opposite the first side.

9. The device according to claim 8,
characterized in that the angular position of the groups of reed contacts (4; 5; 6) is fixedly specified with respect to the electrical conductor (8).

10. The device according to claim 1,
characterized in that
a housing receiving the components of the device is formed which has a front or side surface provided with means for marking the position and/or for attaching the electrical conductor.

11. The device according to claim 1,
characterized in that
the device is in each case arranged on or near lightning arrester cables of rotor blades in wind turbines.

12. The device according to claim 1,
characterized in that
after expiry of a predetermined or settable time span between the pulse event and data transferal, a time stamp may be generated.

13. The device according to claim 1,
characterized in that
the electrical conductor is an integral part of components or means not carrying lightning current, in particular of hoisting cables or carrier cables of cableways or cranes.

14. Use of a device according to claim 1 for detecting and classifying lightning and overcurrent events having surge current characteristic in the range of <50 A up to 200 kA and pulse shapes as a long-term pulse with T≥10 ms and pulse shapes of 10/350 µs and 8/20 µs.

15. A device for detecting electrical currents on or near electrical conductors with at least one reed contact as a magnetically responsive switch, which is arranged near the electrical conductor such that when there is a significant current flow through the conductor, the magnetic field created triggers the switch and initiates evaluation electronics connected to the switch,
characterized in that
for a detection of surge current variables and differentiation between long-term pulsed currents having a duration of T≥10 ms, on the one hand, and short-term pulsed currents having a pulse shape of 10/350 µs or 8/20 µs, on the other, a plurality of reed contacts (4; 5; 6) is arranged at pre-determined, different and increasing distances from the electrical conductor (8), wherein the evaluation electronics determine the response and the switching times of the respective reed contacts (4; 5; 6), from the association of the determined values with the respective reed contact, the surge current variable is determined, and from the switching time, the pulse shape is determined,
characterized in that
the electrical conductor is an integral part of one of a lightning current arrester line, a lightning rod and a surge current carrying overvoltage arrester.

* * * * *